(12) United States Patent
Yu et al.

(10) Patent No.: US 7,449,135 B2
(45) Date of Patent: Nov. 11, 2008

(54) FLEXIBLE PLASTIC SUBSTRATE FOR OPTICAL DISPLAY PRODUCING PROCESS

(75) Inventors: Hsin-Her Yu, Taichung (TW); Kuo-Cheng Hwang, Chang-Hua Hsien (TW); Ming-Chun Tsen, Kaushiong Hsien (TW); Shug-June Hwang, Miau-Li Hsien (TW)

(73) Assignee: National Formosa University, Yunlin (TW)

( * ) Notice: Subject to any disclaimer, the term of this patent is extended or adjusted under 35 U.S.C. 154(b) by 471 days.

(21) Appl. No.: 11/059,675

(22) Filed: Feb. 17, 2005

(65) Prior Publication Data

US 2005/0230858 A1    Oct. 20, 2005

(30) Foreign Application Priority Data

Feb. 19, 2004    (TW) ............................... 93104035 A

(51) Int. Cl.
*B29D 11/00*    (2006.01)

(52) U.S. Cl. ............................ 264/2.6; 264/2.7; 264/28; 264/235; 264/346

(58) Field of Classification Search .................. 264/1.1, 264/1.6, 2.6, 2.7, 1.34, 28, 235, 237, 346
See application file for complete search history.

(56) References Cited

U.S. PATENT DOCUMENTS

| | | | | |
|---|---|---|---|---|
| 3,632,841 | A | * | 1/1972 | Fortin .......................... 264/1.6 |
| 5,155,207 | A | * | 10/1992 | Senatore et al. ............. 528/388 |
| 6,844,403 | B2 | * | 1/2005 | Oshima et al. .............. 526/171 |

FOREIGN PATENT DOCUMENTS

JP    6-306252    * 11/1994

* cited by examiner

*Primary Examiner*—Mathieu D. Vargot
(74) *Attorney, Agent, or Firm*—Rosenberg, Klein & Lee

(57) ABSTRACT

The present invention relates generally to a flexible plastic substrate, its manufacturing process and optical components for optical display applications. In so doing, cyclic olefin copolymer (COC) is placed between upper and lower heat-resistant sheets, then heated and pressurized by hot press to form a COC film. Next, the film is subjected to quenching treatment in ice water, and then heat treatment in vacuum drying oven after being placed between two flat plates. Finally, a COC plastic substrate with a high degree of optical penetration, low water permeability and low roughness is shaped, which can be efficiently applied to optical display thanks to its simple processing, lightweight, thin-profile and flexibility.

3 Claims, 10 Drawing Sheets

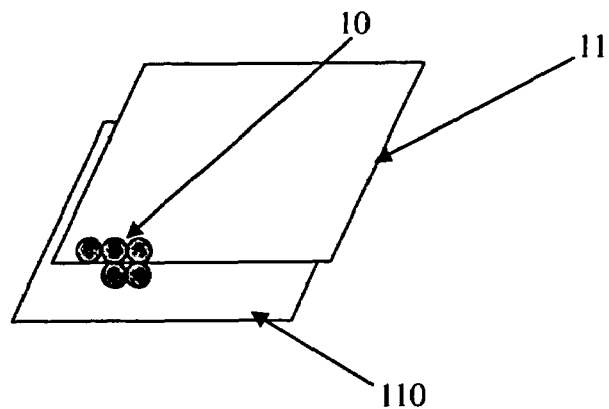
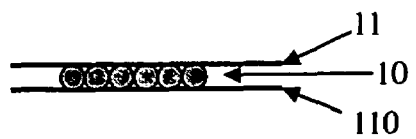
FIG. 2  FIG. 3
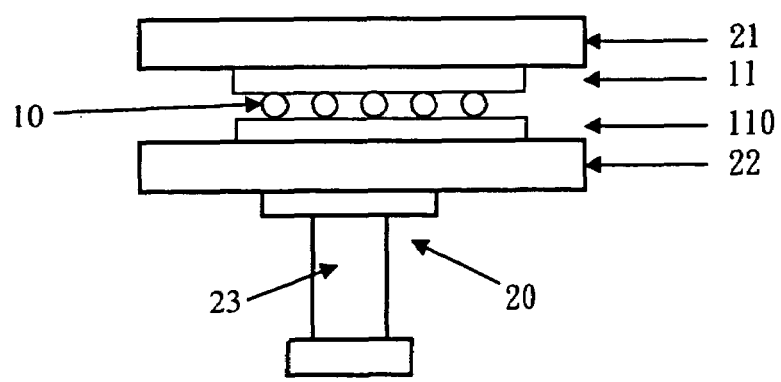
FIG. 4

$R_1, R_2, R_3 : H, C_mH_n$

FLEXIBLE PLASTIC SUBSTRATE FOR OPTICAL DISPLAY PRODUCING PROCESS

FIELD OF THE INVENTION

The present invention relates generally to a flexible plastic substrate, its manufacturing process and optical components for optical display applications, and more particularly to a flexible plastic substrate which is made of cyclic olefin copolymer (COC). In so doing, COC is placed between upper and lower heat-resistant sheets to form a film after heating and pressurization. Next, the film is subjected to quenching treatment and heat treatment to form a COC plastic substrate with a high degree of optical penetration, low water permeability and low surface roughness, which can be efficiently applied to optical display thanks to its simple processing, lightweight, thin-profile and flexibility.

BACKGROUND OF THE INVENTION

Considering the manufacturing cost and technology, traditional flat panel displays are generally based on glass plates. However, traditional glass plates with a bigger weight are more fragile owing to lower impact resistance and poor flexibility, while plastic substrates can remove these disadvantages thanks to lightweight and better impact resistance. Moreover, a higher degree of flexibility and better processing characteristics of plastic substrate can offer an improved design of new-generation of flat panel display with regard to the profile and warpage, but also underline the future-proof technical development trend.

The plastic substrates commercially available include Polyethylene terephathalate (PET), Ployethersulfone (PBS) and polycarbonate (PC), all of which are not suitable for optical plastic substrates with regard to their optical penetration, glass inversion temperature (Tg), water permeability and surface roughness. Among them, the biggest barrier of applying flexible plastic substrate to Organic Light Emitter Diode (OLED) lies in its extreme sensitiveness to moisture, which has a great influence upon the stability of OLED components. Take PET plastic substrate, for example, the water permeability at 25° is about 14 gm/m$^2$-day, far higher than the tolerance limit. Furthermore, the surface roughness of plastic substrate will affect the image quality of display. In the event of excessive surface roughness, the evaporated organic light emitter layer will likely generate dark spots and point discharge at the surface of backing material, causing damage to the organic light emitter layer and impairing greatly the display quality.

Moreover, traditional plastic substrates are manufactured through Roll-to-Roll Manufacturing and Roll to Sheet Processing modes, both of which require expensive machine tools. Therefore, traditional glass plates and traditional plastic substrates cannot satisfy these requirements of new-generation for lightweight, thin-profile and flexibility. According to existing know-how, vapor deposition process is used to form a deposition film on plastic substrate, but cannot overcome lower optical penetration of traditional plastic substrates. In addition, the plastic substrates for packaging purpose are not applied for optical display. According to U.S. Pat. No. 5,939,189, the flexible plastic substrates are fitted with an antireflection coating to reduce color reflection. Yet, this example only represented traditional PET plastic substrates with an antireflection coating, which has not realized higher optical penetration, lower water permeability and surface roughness.

As flexible displays are universally available, the flexible displays made of traditional plastic substrates will not only encounter difficulty in manufacturing process, but also affect the product quality and performance to a great extent. Despite of lightweight, good impact resistance and better flexibility, traditional plastic substrates have a poor water permeability and surface roughness. Thus, there is an urgent demand to bring you a key technology of improving plastic substrate's water permeability and surface roughness.

SUMMARY OF THE INVENTION

The primary objective of the present invention is to provide a flexible plastic substrate and its manufacturing process, which can be efficiently applied to optical display and bring optical display units into full play thanks to simple manufacturing, light-weight, thin-profile and higher flexibility. According to this technology, cyclic olefin copolymer (COC) is placed between upper and lower heat-resistant sheets, then heated and pressurized by hot press to form a COC film. Next, the film is subjected to quenching treatment in ice water, and then heat treatment between two flat plates to form a COC plastic substrate with a high degree of optical penetration, low water permeability and low surface roughness.

BRIEF DESCRIPTION OF THE DRAWINGS

FIG. 2 is a Perspective view of Cyclic Olefin Copolymer (COC) within Two Aluminum Foils;

FIG. 3 is a Cross Section of Cyclic Olefin Copolymer (COC) within Two Aluminum Foils;

FIG. 4 is a Schematic Drawing of Hot-Pressing of Present Invention;

DETAILED DESCRIPTION OF THE PREFERRED EMBODIMENT

The features and the advantages of the present invention will be more readily understood upon a thoughtful deliberation of the following detailed description of a preferred embodiment of the present invention with reference to the accompanying drawings.

Figure 11:
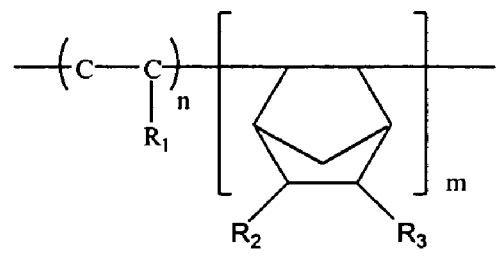
FIG. 11 is a Chemical Structure Drawing of Cyclic Olefin Copolymer (COC) of Present Invention.

As shown in FIGS. 1-6, the manufacturing process embodied in the present invention is as follows:

The cyclic olefin copolymer (COC) 10 (with its chemical structural formula shown in FIG. 11, wherein, $R_1$, $R_2$ and $R_3$ individually represent a hydrogen atom or a hydrocarbon group) is placed between upper and lower heat-resistant sheets 11, 110 (represented by aluminum foil in the present invention) (see FIGS. 2-3).

The heat-resistant sheets 11, 110 and cyclic olefin copolymer (COC) 10 are placed between upper and lower pressure plates 21, 22 of hot press machine 20, where they are pressurized for 1.5~2.5 minutes (a duration of 2 minutes for a preferred embodiment of the present invention) at a controlled compression temperature of 200° C.~280° C. (240° C. for a preferred embodiment of the present invention), and a compression force value of 80 kg/cm$^2$~120 kg/cm$^2$ (100 kg/cm$^2$ for a preferred embodiment of the present invention), thereby forming a cyclic olefin copolymer (COC) film 100 (see FIG. 4).

Figure 1:
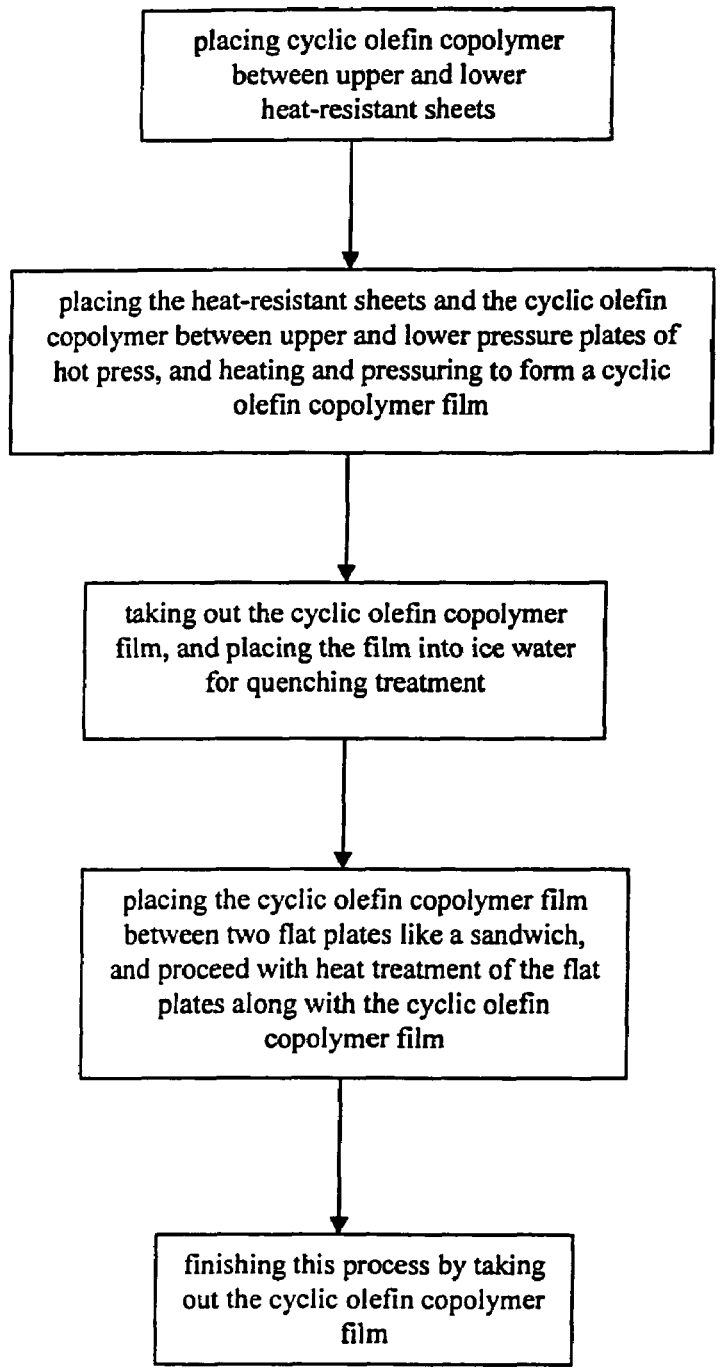
FIG. 1 is a Manufacturing Flow Chart of the Present Invention.
Figure 5:
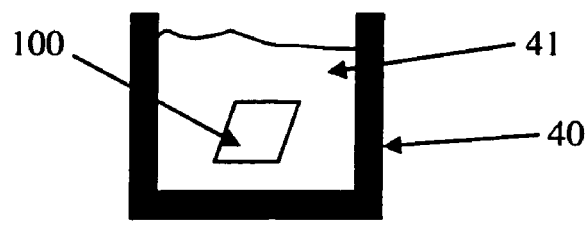
FIG. 5 is a Schematic Drawing of Quenching Treatment of Present Invention.

Then, take out cyclic olefin copolymer (COC) film 100, and place into 5° C.~0° C. ice water 41 (0° C. for a preferred embodiment of the present invention) for 1~3 minutes quenching treatment (2 minutes for a preferred embodiment of the present invention) (see FIG. 5).

Next, place the cyclic olefin copolymer (COC) film 100 between two flat plates 31, 32 (made of glass in this embodiment) like a sandwich, and proceed with heat treatment of the flat plates 31, 32 along with cyclic olefin copolymer (COC) film 100. In this embodiment of present invention, the film 100 is placed into a vacuum drying oven 30 for a 3~5 hours annealing (4 hours in this embodiment) at an operating temperature of 200° C.~300° C. (an annealing temperature of 250° C. for a preferred embodiment of the present invention) (see FIG. 6).

Finally, take out cyclic olefin copolymer (COC) film 100 to form an optical plastic substrate of present invention.

Figure 6:
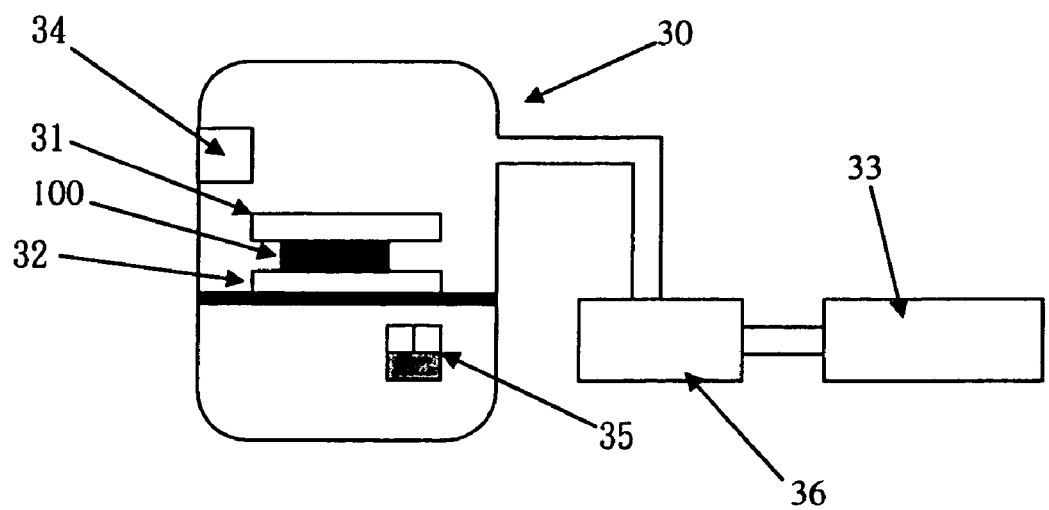
FIG. 6 is a Schematic Drawing of Heat Treatment of Vacuum Drying Oven.

As shown in FIGS. 4-6, this unit embodied in the present invention comprises:

a hot press machine 20 fitted with upper and lower pressure plates 21, 22 and a drive unit 23;

an ice water tank 40 filled with ice water 41 for quenching purpose;

a vacuum drying oven 30 for heat treatment;

a vacuum motor 33, used to pump out the vacuum drying oven 30;

two flat plates 31, 32 used to retain cyclic olefin copolymer (COC) film 100;

a heater 34, used to heat up the vacuum drying oven 30; and a controller 35 used to control the heating-up temperature of the heater 34.

Of which, a filter 36 is installed within the channel between vacuum motor 33 and oven 30, so as to protect vacuum motor by filtering the pumped air.

Figure 7:
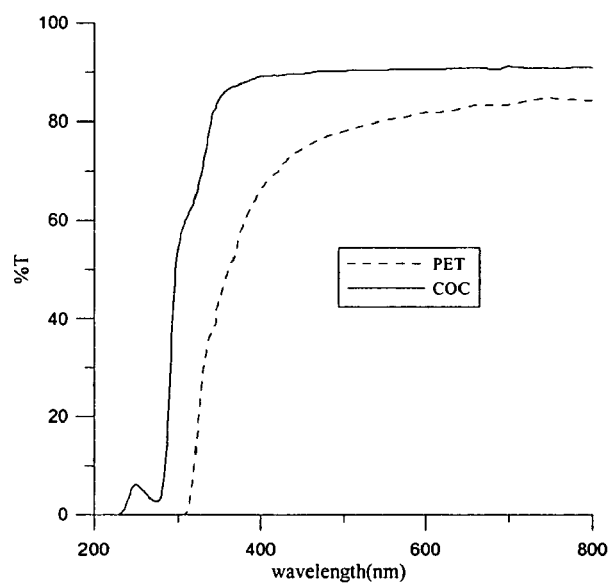
FIG. 7 is a Comparison Diagram of Optical Penetration of COC Plastic substrates and Traditional PET Plastic substrates under Visible Spectrum.

The differences of COC plastic substrates of present invention and traditional PET plastic substrates commercially available are as follows:

1. Optical penetration: optical penetration of annealed COC plastic substrates is about 91%, and that of PET plastic substrates commercially available about 81%, as shown in FIG. 7.

Figure 8:
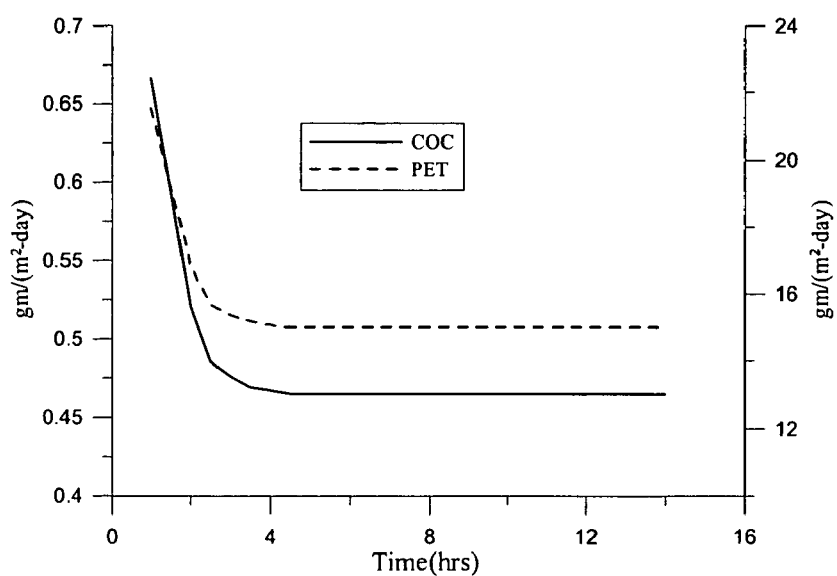
FIG. 8 is a Comparison Diagram of Water Permeability of COC Plastic substrates and Traditional PET Plastic substrates.

2. FIG. 8 shows the comparison diagram of water permeability between COC plastic substrates of present invention and traditional PET plastic substrates via the help of a tester, among which water permeability of COC plastic substrate is about 0.45 gm/m$^2$-day, far less than 13.796 gm/m$^2$-day of PET plastic substrate.

Figure 9:
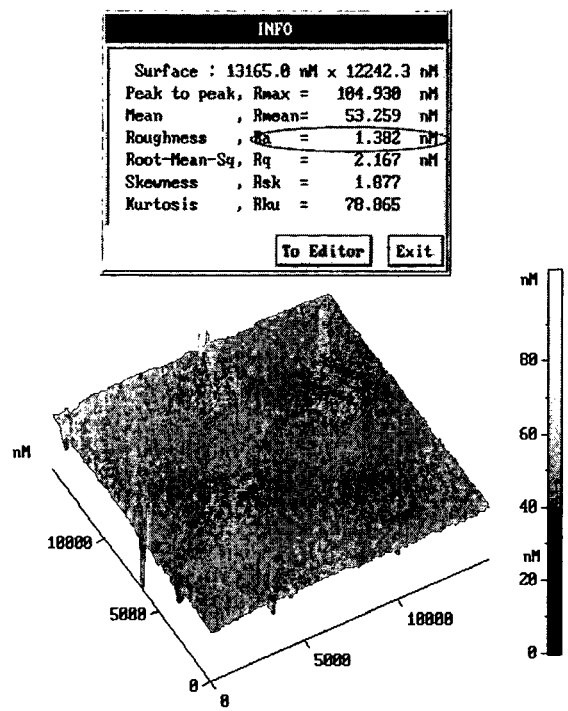
FIG. 9. Survey Drawing of Roughness of Plastic substrates of Present Invention.
Figure 10:
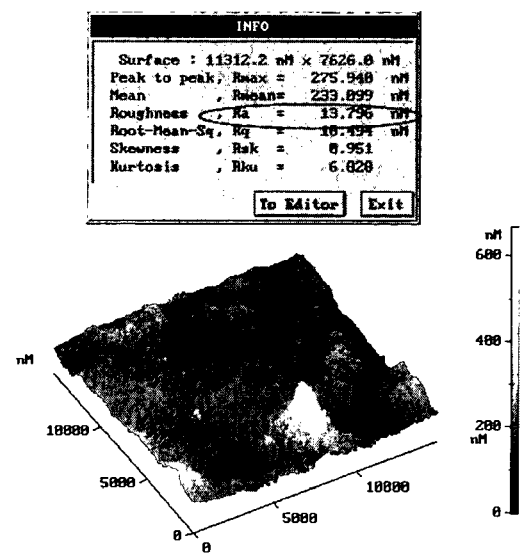
FIG. 10 is a Survey Drawing of Roughness of Traditional PET Plastic substrates.

3. FIG. 9 depicts how to measure COC plastic substrate of present invention via atomic force microscope (AFM); FIG. 10 shows the surface roughness of traditional PET plastic substrate. The roughness of COC plastic substrate of present invention is (Ra) 1.382 nm (nanometer) as shown in FIG. 9, and that of traditional PET plastic substrate is Ra) 13.796 nm (nanometer) as shown in FIG. 10.

The aforementioned values show that cyclic olefin copolymer (COC) plastic substrate of present invention distinguishes itself by a higher degree of optical penetration, good water-tightness and low surface roughness. Cyclic olefin copolymer (COC) plastic substrate of present invention can exploit its performance for optical display within a limited range, namely, optical penetration of 81%~93%, water permeability of 0.42 gm/m$^2$-day~0.48 gm/m$^2$-day, and roughness Ra of 1.25 nm (nanometer)~1.5 nm.

The plastic substrate of present invention has the following features:

1. High water-tightness: water-tightness plays a major role for OLED's stability when a flexible plastic substrate is applied to OLED. In this respect, flexible COC plastic substrate of present invention can help improve the stability of OLED thanks to its low water permeability of 0.45 gm/m$^2$-day.

2. Low surface roughness: COC plastic substrate of present invention has a roughness (Ra) about 1.3482 nm, far less than 13.796 nm of traditional PET plastic substrate. In the event of excessive surface roughness, the evaporated organic light emitter layer will likely generate dark spots and point discharge at the surface of backing material, causing damage to the organic light emitter layer and impairing greatly the display quality. With a lower degree of surface roughness, COC plastic substrate of present invention can improve the quality of OLED for optical display.

3. High optical penetration: With an extremely high optical penetration, COC plastic substrates of present invention are well-suited for the applications of OLED plastic substrate. Generally, OLED plastic substrate materials require a higher degree of optical penetration (>80%), which is helpful to improve luminous efficiency of OLED, reduce power consumption and prolong the service life of OLED.

Therefore, the plastic substrate of present invention has the following advantages:

1. When compared to traditional plastic substrates, COC plastic substrate of present invention has a higher degree of optical penetration, glass inversion temperature (Tg), lower water permeability and better surface roughness.

2. It is manufactured only by a hot press and a vacuum drying oven. The performance of plastic substrate, such as optical penetration, glass inversion temperature, water permeability and surface roughness, can compare favorably with those manufactured by large machine tools.

3. The "COC plastic substrate of lower water permeability" features a lightweight and thin-profile, thus removing the disadvantages of traditional glass displays such as fragility and poor impact resistance. Meanwhile, a higher degree of flexibility and better processing characteristics of plastic substrate offer an improved design of new-generation of flat panel display with regard to the profile and warpage.

4. Flexible plastic substrates can be made of COC materials through simple heat treatment, and act as OLED (Organic Light Emitter Diode) plastic substrates of Flat panel Display after actual experiment. In terms of water permeability, optical penetration, surface roughness, luminous efficiency and drive voltage, this plate has a higher performance than flexible plastic substrate currently available.

5. High-performance plastic substrates of present invention can be applied to electronics industries, such as OLED, TFT, PDA, electronic paper and flexible solar battery.

Figure 12:
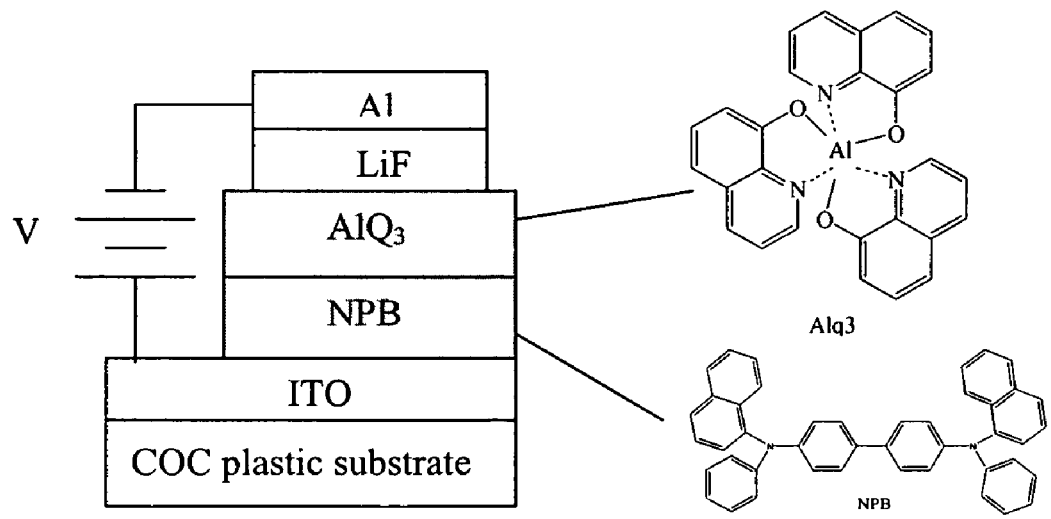
FIG. 12 is a Structure Drawing of OLED Developed from COC Plastic substrates and Chemical Structure Drawing of Applied Materials.
Figure 13:
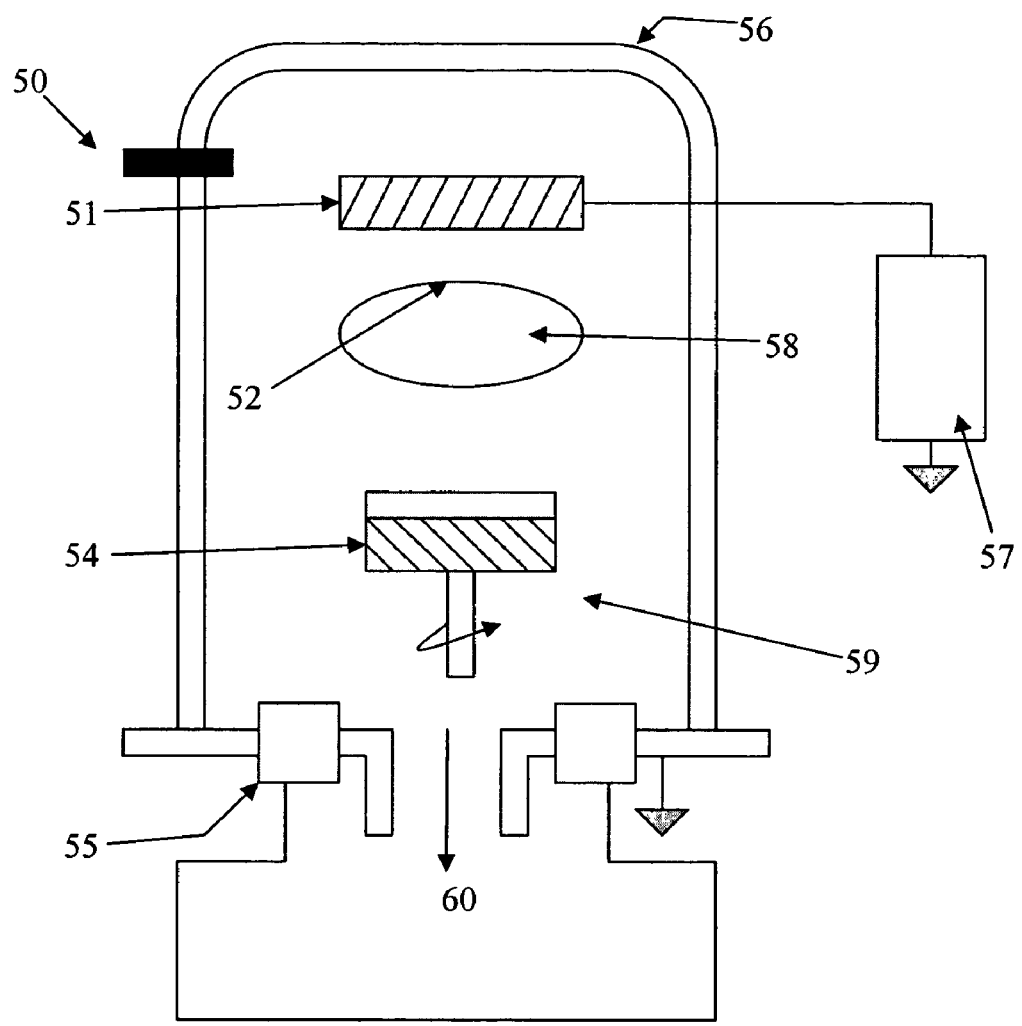
FIG. 13 is a Schematic Drawing of Sputter System of Present Invention.
Figure 14:
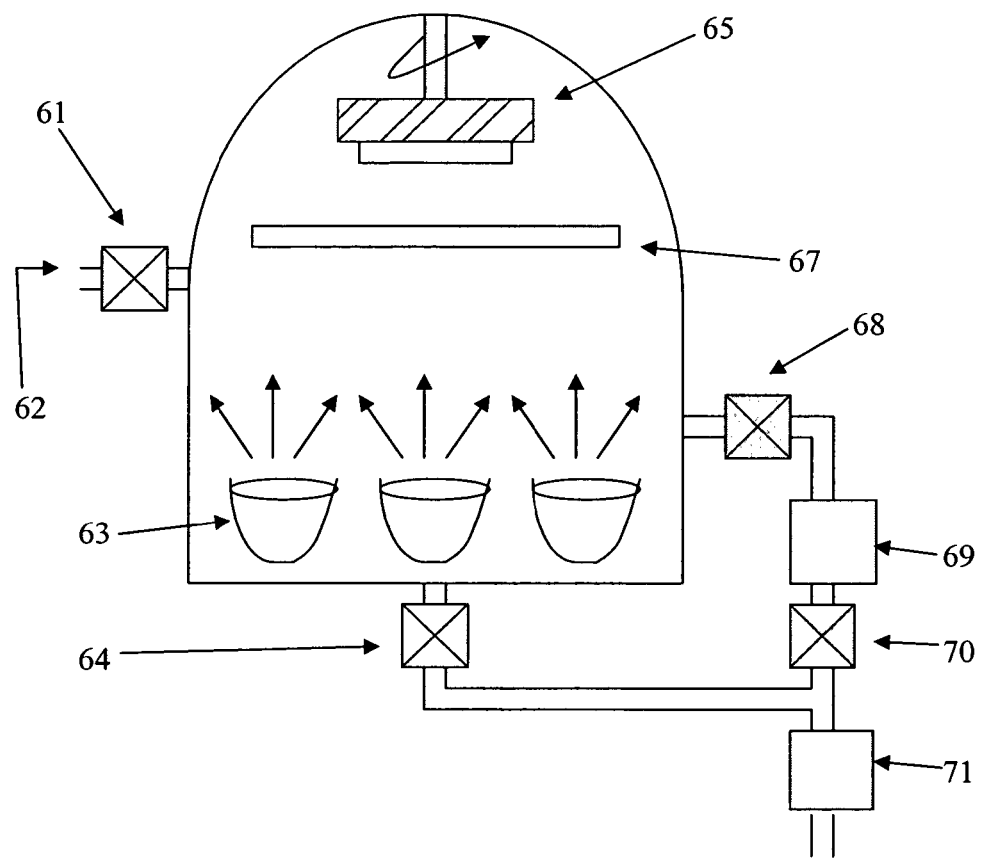
FIG. 14 is a Schematic Drawing of Thermal Evaporator System of Present Invention.
Figure 15:
FIG. 15 is a Schematic Drawing of Manufacturing Process 1 of TFT.
Figure 16:
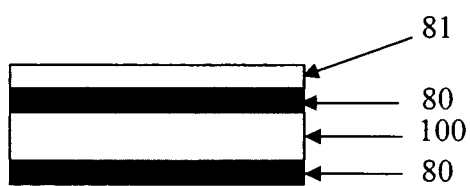
FIG. 16 is a Schematic Drawing of Manufacturing Process 2 of TFT.
Figure 17:
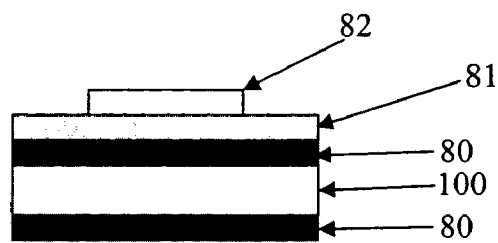
FIG. 17 is a Schematic Drawing of Manufacturing Process 3 of TFT.
Figure 18:
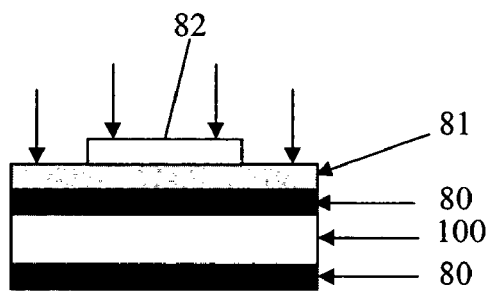
FIG. 18 is a Schematic Drawing of Manufacturing Process 4 of TFT.
Figure 19:
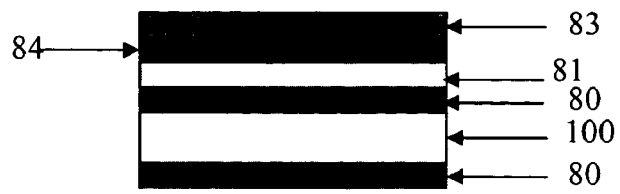
FIG. 19 is a Schematic Drawing of Manufacturing Process 5 of TFT.

As shown in FIGS. 13-14, Organic Light Emitter Diode films can be made of plastic substrates of present invention, with the structure described below (FIG. 12).

The manufacturing process comprises:

After cleaning up COC plastic substrate 53, place it to sputter unit for sputter coating of indium tin oxide (ITO) transparent conductive film 90. As shown in FIG. 3, a sputter unit comprises an Ar (argon) inlet 50, target 51, negative electrode 52, foundation base 54, insulator 55, sputter room 56, power supply 57, plasma 58, positive electrode 59, and a vacuum system 60. After completion of sputtering, clean it again and take a proper plastic substrate 53 to fix it onto a holder of organic film's vacuum evaporator. As shown in FIG. 14, the evaporator comprises a nitrogen inlet 61, valve 62, firepot 63, control valve 64, foundation base 65, baffle plate 67, microflow valve 68, turbine pump 69, control valve 70 and a Roots pump 71. Place Naphthyl-phenyl benzidine (NPB), aluminum oxide ($AlO_3$) and lithium fluoride (LiF) into the firepot of evaporator, then close its shutter and pump out to $10^{-6}$ tour.

The evaporation procedure of organic substances is: evaporate the plastic substrate 53 from down-to-top. Firstly, open the shutter of Naphthyl-phenyl benzidine (NPB) and heat up to a proper temperature. When Naphthyl-phenyl benzidine (NPB) is deposited onto the base plate up to a proper thickness, close the shutter. Then, open the shutter of aluminum oxide ($AlO_3$) and heater to heat it up to a proper temperature. When aluminum oxide ($AlO_3$) is deposited to a proper thickness, close its shutter.

Next, open the shutter of lithium fluoride (LiF) and heater to evaporate lithium fluoride (LiF). When a thickness of 50 nanometers is reached, close the shutter. A moderate thickness is sufficient since lithium fluoride (LiF) is primarily used for electronic transmission (not a major electronic transmission layer).

When the evaporation of organic film is completed, pump it out to a normal pressure, and take out the coated organic film luminous body to evaporate aluminum materials as negative electrode by thermal evaporator. After finishing all manufacturing processes of Organic Light Emitter Diode (OLED), measure and analyze the features of OLED.

A color analyzer is used to measure and analyze the features of OLED. In so doing, place the samples at 30 cm before the color analyzer, adjust the focal distance of lens with a measurement range of 0.5 cm×0.5 cm, in conjunction with the power supply. Increase 1 volt every time, with a duration of 20 seconds. Connect the power supply and color analyzer to the computer, then control and amend the measurement parameters. Next, record I-V curve, and distinguish the spectral range and position of tone pattern.

As for the processing of OLED as illustrated in FIG. 12, evaporate COC plastic substrate 53 from down-to-top, i.e. indium tin oxide (ITO) transparent conductive film, Naphthyl-phenyl benzidine, aluminum oxide ($AlO_3$), lithium fluoride (LiF) and aluminum (Al) layer.

As shown in FIGS. 15-22, a flexible thin-film transistor (TFT) can be made of plastic substrate of present invention, with the detailed process below:

Firstly, place a proper cyclic olefin copolymer film 100 into Plasma enhanced chemical vapor deposition (PECVD), where $SiO_2$ of 0.75 μm is deposited at both sides of cyclic olefin copolymer film 100 as stress relieving interlayer 80. (See FIG. 15).

Then, a 900 Å amorphous silicon layer 81 is deposited over tress relieving interlayer 80 via direct current sputter. (See FIG. 16).

Photoresist 82 is used to define a grid pattern over n+ amorphous silicon layer 81, thus enabling the channel section to be fully fused for enlarged crystal grains. (See FIG. 17).

Use an excimer laser (XeCl wave length: 308 nm, pulse time 20 ns, energy: 250 mJ/cm2→280 mJ/cm2→330 mJ/cm2) to activate n+ amorphous silicon layer 81, thereby forming a polycrystalline silicon layer. Next, remove the remaining photoresist. (See FIG. 18).

Then, PECVD is used to deposit a 1000 Å grid oxide layer 84 and a 1700 Å aluminum (Al) layer 83. (See FIG. 19).

Figure 20:
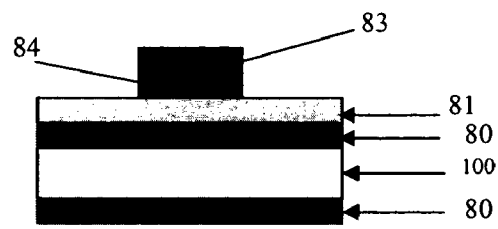
FIG. 20 is a Schematic Drawing 1 of Manufacturing Process 6 of TFT.
Figure 21:
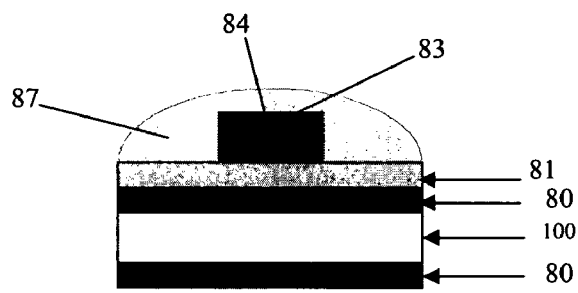
FIG. 21 is a Schematic Drawing 2 of Manufacturing Process 6 of TFT.
Figure 22:
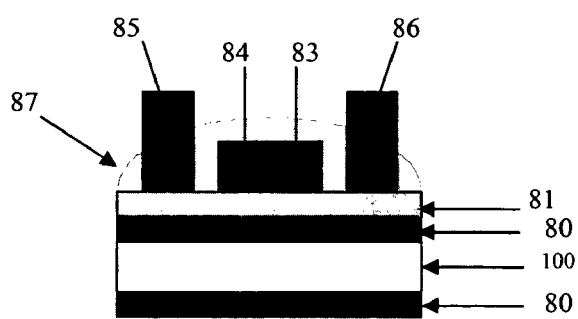
FIG. 22 is a Schematic Drawing of Manufacturing Process 7 of TFT.

Define the position of grid over aluminum layer 83, and etch the positions of drain and source via two-stage etching method (dry etching→wet etching) (See FIG. 20)

Next, the grid is coated by a $SiO_2$ (4700 Å) layer as the insulation layer 87. (See FIG. 21).

Then, define the positions of drain and source via photographic etching technology, and a n+ amorphous silicon layer is deposited on PECVD as drain 86 and source 85. Furthermore, an excimer laser is used to activate drain 86 and source 85, thereby forming a polycrystalline silicon layer. (See FIG. 22).

The above is a detailed description of the technical features of the present invention based on a typical preferred embodiment. However, it should be appreciated that the present invention is capable of various modifications by those skilled in the art, and all such variations or changes shall be embraced within the scope of the following claims.

What is claimed is:

1. A manufacturing process of a flexible plastic substrate for optical display comprising:
    (a) placing cyclic olefin copolymer between upper and lower heatresistant sheets;
    (b) placing the heat-resistant sheets and the cyclic olefin copolymer between upper and lower pressure plates of a hot press machine, and heating and pressurizing at a compression temperature within the approximate range of 200° C.-280° C. to form a cyclic olefin copolymer film;
    (c) taking out the cyclic olefin copolymer film, and placing the film into ice water for quenching treatment;
    (d) placing the cyclic olefin copolymer film between two flat plates, and heat treating in an evacuated compartment the flat plates with cyclic olefin copolymer film disposed therebetween; and
    finishing this process by taking out the cyclic olefin copolymer film wherein steps (a)-(d) to obtain a surface roughness within the approximate range of 1.25 nm -1.5 nm for the cyclic olefin copolymer film.

2. A manufacturing method as claimed in claim 1, wherein the pressurizing employs a of 200°~280°, the pressuring force value of 80 kg/cm$^2$-120 kg/cm$^2$ for a duration of 1.5-2.5 minutes, the quenching treatment is performed at a working temperature of 5° C.-0° C. for a duration of 1-3 minutes, and the heat treating is for annealing purpose, with an annealing temperature of 200° C.-300° C. for a duration of 3-5 hours.

3. A manufacturing method as claimed in claim 1, wherein in the heating and pressurizing, the cyclic olefin copolymer is placed between upper and lower sheets of aluminum foils.

* * * * *